(12) United States Patent
Gu et al.

(10) Patent No.: US 10,492,319 B2
(45) Date of Patent: Nov. 26, 2019

(54) METHOD FOR MAKING HOUSING

(71) Applicants: SHENZHEN FUTAIHONG PRECISION INDUSTRY CO., LTD., Shenzhen (CN); FIH (HONG KONG) LIMITED, Kowloon (HK)

(72) Inventors: Chang-Hai Gu, Shenzhen (CN); Wu-Zheng Ou, New Taipei (TW); Chao-Hsun Lin, New Taipei (TW); Xiao-Kai Liu, Shenzhen (CN)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 289 days.

(21) Appl. No.: 15/492,012

(22) Filed: Apr. 20, 2017

(65) Prior Publication Data

US 2017/0223852 A1  Aug. 3, 2017

Related U.S. Application Data

(62) Division of application No. 14/687,504, filed on Apr. 15, 2015, now Pat. No. 9,728,839.

(30) Foreign Application Priority Data

Dec. 23, 2014 (CN) .......................... 2014 1 0807706

(51) Int. Cl.
*H05K 5/04* (2006.01)
*H04M 1/02* (2006.01)
(Continued)

(52) U.S. Cl.
CPC ................ *H05K 5/04* (2013.01); *B32B 1/02* (2013.01); *B32B 3/14* (2013.01); *B32B 3/266* (2013.01);
(Continued)

(58) Field of Classification Search
CPC ....... B29C 2045/1454; Y10T 29/49826; Y10T 29/49904; Y10T 29/4998; Y10T 29/49982;
(Continued)

(56) References Cited

U.S. PATENT DOCUMENTS 6,216,329 B1 * 4/2001 Kaga ................. B29C 45/14467
264/247
10,262,245 B2 * 4/2019 Sloey ................... H04B 1/3816
(Continued)

FOREIGN PATENT DOCUMENTS

CN 104168730 A 11/2014
JP 2009-38722 A 2/2009
JP 2013-59015 A 3/2013

*Primary Examiner* — Sarang Afzali
*Assistant Examiner* — Darrell C Ford
(74) *Attorney, Agent, or Firm* — ScienBiziP, P.C.

(57) ABSTRACT

A method of making a housing includes: providing a substrate and cutting the substrate to form an opening. The substrate being spaced by the opening to form at least one main base. A plurality of metal sheets and a plurality of reinforcing members are provided. Placing the metal sheets, the reinforcing members and the main base into a mold. The metal sheets is positioned in the opening, adjusts width of each gap between adjacent metal sheets, and between the main base and one metal sheet adjacent to the main base. Locating the reinforcing members in the metal sheets and the main base. Liquid resin is filled into the gaps and covers the reinforcing members to bond the metal sheets, the main base and the reinforcing members together, forming the housing.

17 Claims, 17 Drawing Sheets

(51) Int. Cl.
- *B32B 1/02* (2006.01)
- *B32B 3/14* (2006.01)
- *B32B 3/26* (2006.01)
- *B32B 7/08* (2019.01)
- *G06F 1/16* (2006.01)
- *H01Q 1/24* (2006.01)
- *H05K 5/00* (2006.01)
- *H05K 5/02* (2006.01)
- *H05K 5/03* (2006.01)
- *B32B 15/04* (2006.01)
- *H04B 1/3888* (2015.01)

(52) U.S. Cl.
CPC ............ *B32B 7/08* (2013.01); *B32B 15/04* (2013.01); *G06F 1/1613* (2013.01); *H01Q 1/242* (2013.01); *H01Q 1/243* (2013.01); *H04M 1/026* (2013.01); *H05K 5/0086* (2013.01); *H05K 5/0247* (2013.01); *H05K 5/03* (2013.01); *B32B 2457/00* (2013.01); *H04B 1/3888* (2013.01); *H04M 1/0202* (2013.01)

(58) Field of Classification Search
CPC ......... Y10T 29/49986; Y10T 29/49995; Y10T 29/49996
USPC .......... 264/261; 29/527.1, 527.2, 527.4, 469, 29/557, 558, 428
See application file for complete search history.

(56) References Cited

U.S. PATENT DOCUMENTS

| | | | |
|---|---|---|---|
| 2009/0110852 A1* | 4/2009 | Chiang | G06F 1/1613 428/34.7 |
| 2009/0194308 A1* | 8/2009 | Cheng | B32B 15/01 174/50 |
| 2011/0074650 A1* | 3/2011 | Li | B82Y 30/00 343/872 |
| 2011/0223382 A1* | 9/2011 | Gu | B29C 70/78 428/136 |
| 2012/0157175 A1* | 6/2012 | Golko | G06F 1/1698 455/575.7 |
| 2013/0318766 A1* | 12/2013 | Kiple | B23P 11/00 29/428 |

* cited by examiner

METHOD FOR MAKING HOUSING

CROSS-REFERENCE TO RELATED APPLICATIONS

This application is a division application of U.S. patent application entitled "HOUSING, ELECTRONIC DEVICE USING SAME, AND METHOD FOR MAKING SAME" with application Ser. No. 14/687,504, filed on Apr. 15, 2015 and having the same assignee as the instant application.

This application claims priority to Chinese Patent Application No. 201410807706.9 filed on Dec. 23, 2014, and claims priority to U.S. patent application Ser. No. 14/687,504, filed on Apr. 15, 2015, the contents of which are incorporated by reference herein.

FIELD

The subject matter herein generally relates to a housing, an electronic device using the housing, and a method for making the housing.

BACKGROUND

Metal housings are widely used for electronic devices such as mobile phones or personal digital assistants (PDAs). Antennas are also important components in electronic devices. But the signal of the antenna located in the metal housing is often shielded by the metal housing.

BRIEF DESCRIPTION OF THE FIGURES

Implementations of the present technology will now be described, by way of example only, with reference to the attached figures.

DETAILED DESCRIPTION

Figure 1:
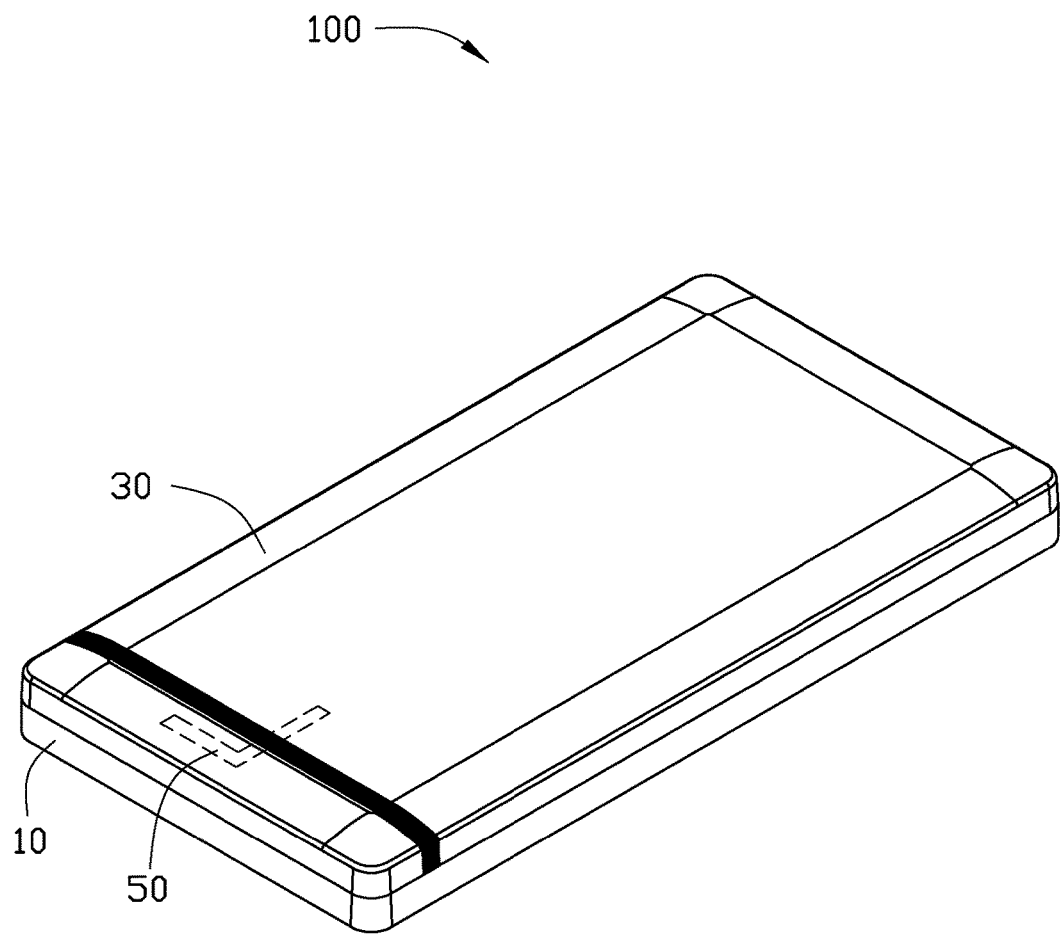
FIG. 1 is an isometric view of an electronic device, according to an exemplary embodiment.
Figure 2:
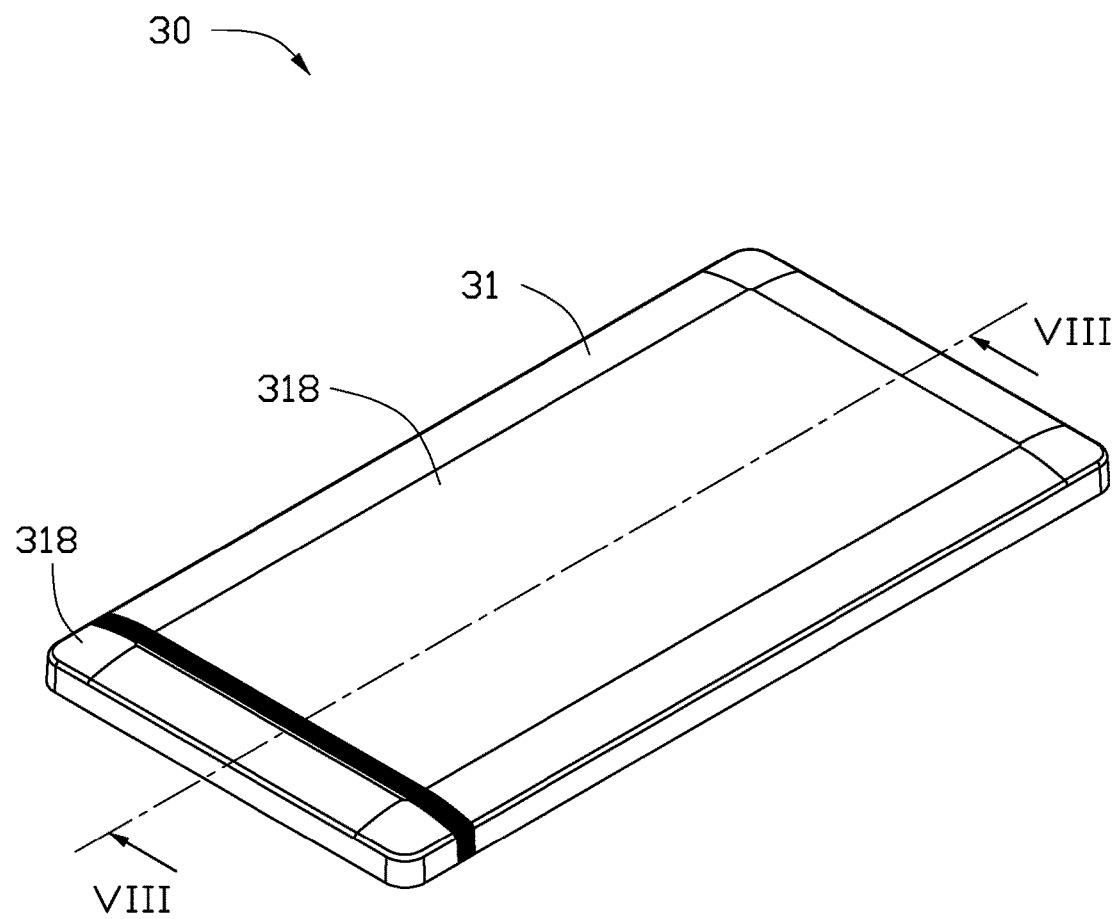
FIG. 2 is an isometric view of a housing of the electronic device shown in FIG. 1, according to a first exemplary embodiment.
Figure 3:
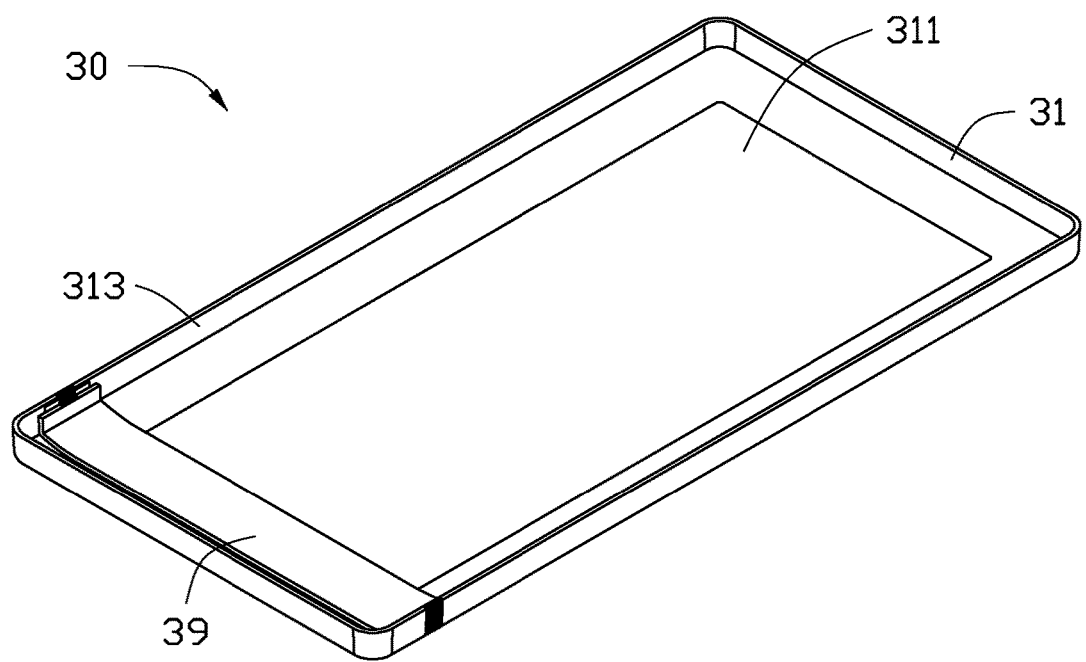
FIG. 3 is similar to FIG. 2, but shown from another angle.
Figure 4:
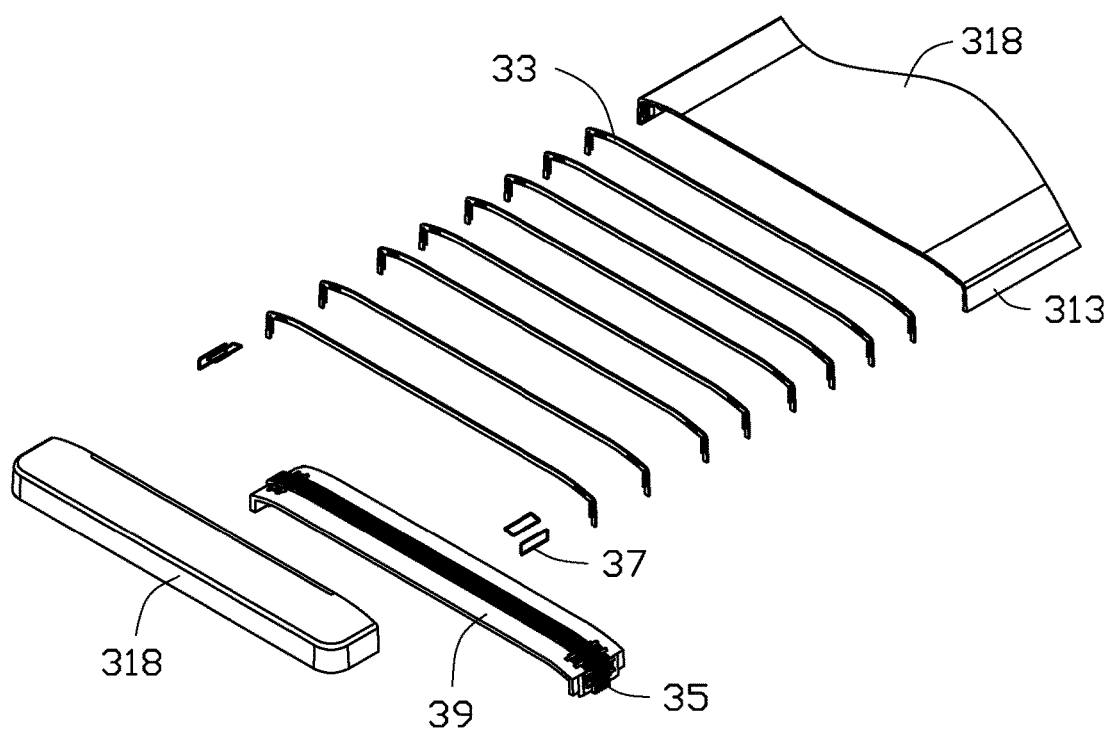
FIG. 4 is an exploded, isometric view of the housing shown in FIG. 2.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like. The term "coupled" when utilized, means "either a direct electrical connection between the things that are connected, or an indirect connection through one or more passive or active intermediary devices, but not necessarily limited to".

FIG. 1 illustrates an electronic device 100 according to an exemplary embodiment. The electronic device 100 can be, but not limited to, a mobile phone, a personal digital assistant or a tablet computer. The electronic device 100 includes a body 10, a housing 30 assembled to the body 10, and an antenna 50 located inside the housing 30.

FIGS. 2-5 illustrate that the housing can have a sheet shape. In at least one exemplary embodiment, the housing 30 can be a back cover of the electronic device 100. The housing 30 include a substrate 31, a plurality of metal sheets 33, a plurality of connecting members 35, a plurality of reinforcing member 37 located in the substrate 31 and the metal sheets 33, a non-conductive member 39 and a protective layer (not shown) formed on a surface of the substrate 31. The substrate 31 can bond with the metal sheets 33 through the connecting members 35.

The substrate 31 can be made of a metal which can be selected from a group consisting of stainless steel, aluminum, aluminum alloy, magnesium, magnesium alloy, titanium, titanium alloy, copper and copper alloy.

Figure 5:
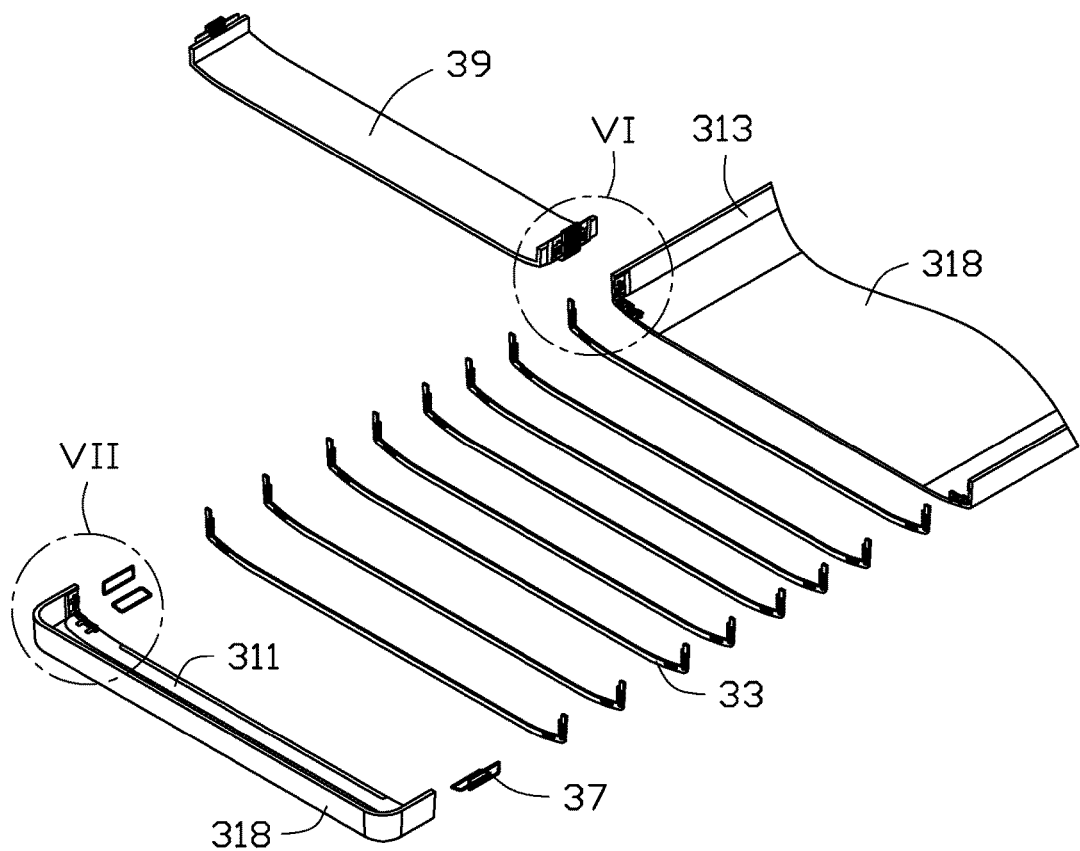
FIG. 5 is similar to FIG. 4, but shown from another angle.
Figure 6:
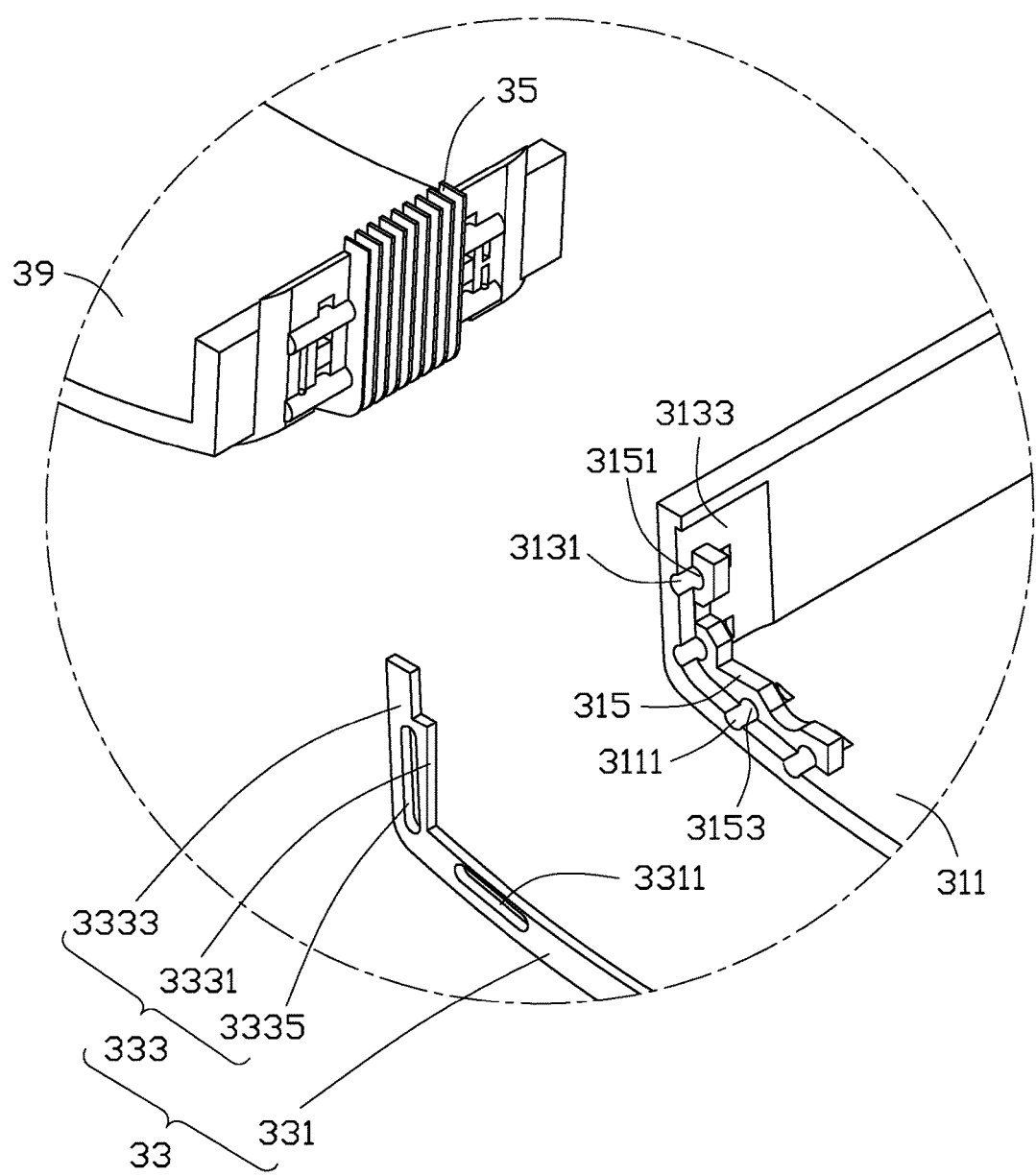
FIG. 6 is an enlarged, isometric view of a circled portion VI shown in FIG. 5.

FIG. 5-6 illustrate that the substrate 31 includes a footwall 311, two opposite sidewalls 313 and two pairs of two opposite fastening structures 315. The sidewalls 313 are respectively located at two opposite sides of the footwall 311. The two pairs of two opposite fastening structures 315 are respectively located at two opposite sides of the substrate 31.

In at least one exemplary embodiment, the thickness of the footwall 311 and the sidewalls 313 are all less than 0.5 mm; preferably, the thickness of the footwall 311 and the sidewalls 313 can be about 0.3 mm to about 0.5 mm.

The two opposite sides of the footwall 311 both has a plurality of grooves 3111 corresponding to the fastening structures 315. In at least one exemplary embodiment, the number of the grooves 3111 can be eight. The sidewall 313 also has a plurality of grooves 3131 corresponding to the fastening structures 315. In at least one exemplary embodiment, the number of the grooves 3131 can be eight.

In at least one exemplary embodiment, a surface of each sidewall 313 forms a accommodating groove 3133, the non-conductive member 39 can cover at least a portion of the footwall 311 and the accommodating groove 3133.

In alternative embodiments, a surface of each sidewall 313 does not form an accommodating groove 3133, the non-conductive member 39 can cover at least a portion of the footwall 311 and the sidewall 313.

It is to be understood that the location, the shape, and the dimension of the at least a portion can be designed according to the housing 30.

One end of each fastening structure 315 is located at the sidewall 313, the opposite end of the fastening structure 315 is located at the footwall 311 along a direction extending from the sidewall 313 to the footwall 311. Each end of the fastening structure 315 located at the sidewall 313 also has two through-holes 3151 corresponding to the grooves 3131, each end of the fastening structure 315 located at the footwall 311 has two through-holes 3153 corresponding to the grooves 3111. The number of the through-holes 3151, 3153 can both be eight. The through-holes 3151, 3153 can cooperate with the grooves 3131, 3111 to receive reinforcing members 37.

Figure 7:
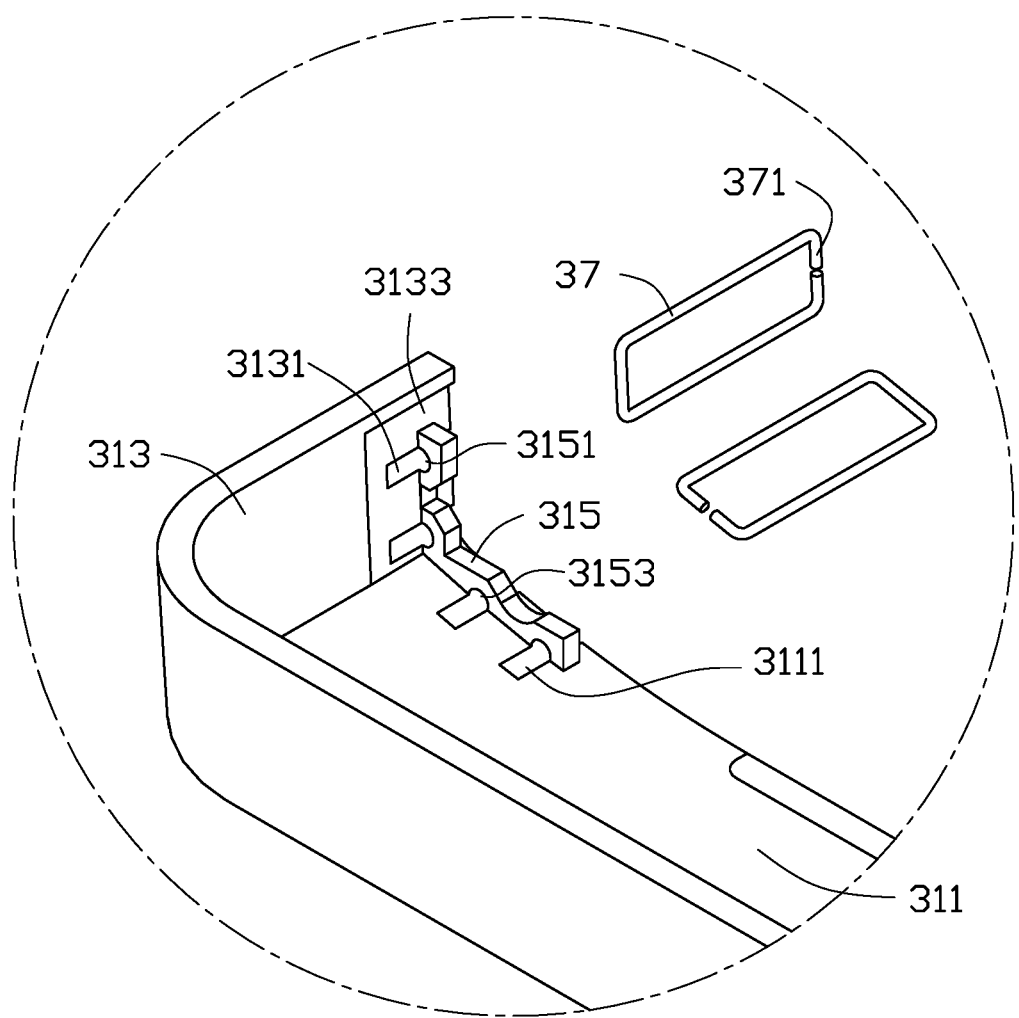
FIG. 7 is an enlarged, isometric view of a circled portion VII shown in FIG. 5.
Figure 8:
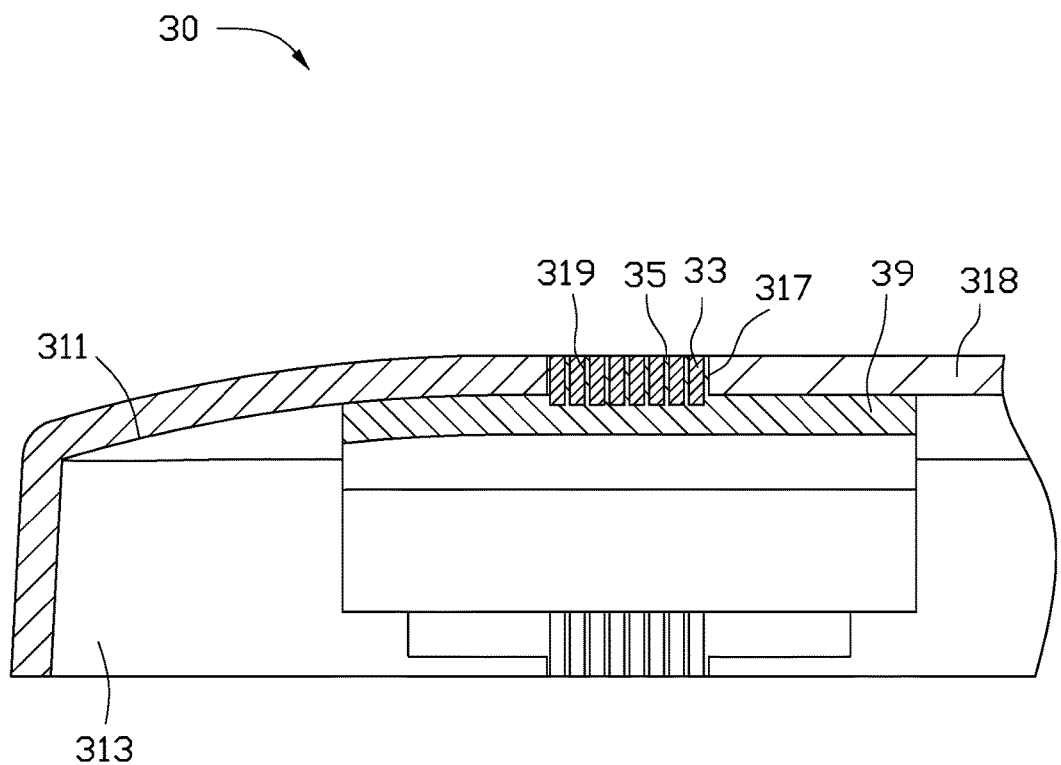
FIG. 8 is a cross-sectional view of the housing along line VIII-VIII of FIG. 2.

FIGS. 7-8 illustrates that a portion of the substrate 31 has an opening 317 by cutting the substrate 31. The metal sheets 33 and the connecting member 35 can be positioned in the opening 317. The antenna 50 aligns with the opening 317, the connecting members 35 and the non-conductive member 39, such that signal can pass through the substrate 31. In at least one exemplary embodiment, the substrate 31 can be spaced by the opening 317, forming two separated main bases 318.

A dielectric layer (not shown) can be formed on a surface of each main body 318. The dielectric layer has a thickness of about 8 μm to about 25 μm. In at least one exemplary embodiment, the dielectric layer can be formed through an anodic oxidation process, the dielectric layer has a thickness of about 8 μm to about 15 μm, and a plurality of holes (not shown) can be formed on the dielectric layer. In alternative embodiments, the dielectric layer can be formed by spraying insulative paint on the main bases 318, the dielectric layer has a thickness of about 15 μm to about 25 μm. The insulative paint can be a polyester paint, a polyurethane paint or a polyamide-imide paint.

It is to be understood that the main bases 318 cannot couple with the antenna 50 as the main bases 318 are covered with the dielectric layer, such that the main bases 31 are not used as a part of the antenna 50 assembly of the electronic device 100, signals of the antenna 50 can pass through the opening 317, such that the antenna 50 can have a high radiation efficiency.

A dielectric layer (not shown) can also be formed on each metal sheet 33. The dielectric layer has a thickness of about 8 μm to about 25 μm. In at least one exemplary embodiment, the dielectric layer can be formed through an anodic oxidation process, the dielectric layer has a thickness of about 8 μm to about 15 μm, and a plurality of holes (not shown) can be formed on the dielectric layer. In alternative embodiments, the dielectric layer can be formed by spraying insulative paint on the metal sheets 33, the dielectric layer has a thickness of about 15 μm to about 25 μm. The insulative paint can be a polyester paint, a polyurethane paint or a polyamide-imide paint.

Each metal sheet 33 includes an end wall 331, and two sidewalls 333, the sidewalls 333 are perpendicularly connected with two opposite ends of the end wall 331, respectively, as shown in FIGS. 5-6. Each metal sheet 33 has a width of about 0.15 mm to about 1.0 mm along a direction from a connecting member 35 located at one side of a metal sheet 33 to an adjacent connecting member 35 located at the opposite side of the metal sheet 33. The metal sheets 33 can be made of a metal which can be selected from a group consisting of stainless steel, aluminum, aluminum alloy, magnesium, magnesium alloy, titanium, titanium alloy, copper and copper alloy.

Two opposite ends of the end wall 331 both have a cavity 3311. The end wall 331 has a width of about 0.8 mm to about 1.0 mm perpendicular to a direction from a connecting member 35 located at one side of a metal sheet 33 to an adjacent connecting member 35 located at the opposite side of the metal sheet 33.

Each sidewall 333 includes a bending member 3331 and an extending member 3333.

The two opposite ends of each end wall 331 bend along a direction perpendicular to the end wall 331, forming the bending members 3331. Each bending member 3331 has a cavity 3335. Each bending member 3331 has a width of about 0.8 mm to about 1.0 mm perpendicular to a direction from a connecting member 35 located at one side of a metal sheet 33 to an adjacent connecting member 35 located at the opposite side of the metal sheet 33.

Each bending member 3331 extends away from the end wall 331, forming the extending member 3333. Each extending member 3333 has a width of about 0.3 mm to about 0.5 mm perpendicular to a direction from a connecting member 35 located at one side of a metal sheet 33 to an adjacent connecting member 35 located at the opposite side of the metal sheet 33. The width of the extending members 333 is equal to the thickness of the sidewall 313.

The metal sheets 33 can be positioned in the opening 317 of the substrate 31. Gaps 319 between each two adjacent dielectric layers covered on the metal sheets 33 have a width of about 0.02 mm to about 0.7 mm along a direction from a connecting member 35 located at one side of a metal sheet 33 to an adjacent connecting member 35 located at the opposite side of the metal sheet 33. Gaps 319 between the dielectric layers covered on the main bases 318 and the adjacent dielectric layers covered on the metal sheets 33 adjacent to the main bases 318 have a width of about 0.02 mm to about 0.7 mm along a direction from a connecting member 35 located at one side of a metal sheet 33 to an adjacent connecting member 35 located at the opposite side of the metal sheet 33. The connecting members 35 can be respectively positioned in the gaps 319, and connected with the dielectric layers of the metal sheets 33 and the main bases 318, such that each two adjacent metal sheets 33, and the main bases 318 and the metal sheets 33 adjacent to the main bases 318 can be bonded together. The connecting member 35 has a width of about 0.02 mm to about 0.7 mm along a direction from a connecting member 35 located at one side of a metal sheet 33 to an adjacent connecting member 35 located at the opposite side of the metal sheet 33.

It is to be understood, the metal sheets 33 and the main bases 318 do not have the dielectric layer, and gaps 319 between each two adjacent metal sheets 33 can be about 0.02 mm to about 0.7 mm along a direction from a connecting member 35 located at one side of a metal sheet 33 to an adjacent connecting member 35 located at the opposite side of the metal sheet 33. Gaps 319 between the main bases 318 and the metal sheets 33 adjacent to the main bases 318 can be about 0.02 mm to about 0.7 mm along a direction from a connecting member 35 located at one side of a metal sheet 33 to an adjacent connecting member 35 located at the opposite side of the metal sheet 33. The connecting member 35 can be positioned in the gaps 319 respectively, and directly connected with the metal sheets 33 and the main bases 318, such that each two adjacent metal sheets 33, and the main bases 318 and the metal sheets 33 adjacent to the main bases 318 can be bonded together.

It is to be understood that, when the metal sheets 33 and the main bases 318 are not covered with the dielectric layers, the substrate 31 can be coupled with the antenna 50, and the substrate 31 can be a part of the antenna 50 assembly of the electronic device 100, signals of the antenna 50 can pass through the gaps 319, such that the antenna 50 can have a high radiation efficiency.

In alternative embodiments, when the metal sheets 33 and the main bases 318 are not covered with dielectric layers, the substrate 31 is not coupled with the antenna 50, such that the main bases 31 is not used as a part of the antenna 50 assembly of the electronic device 100, signals of the antenna 50 can pass through the gaps 319 and the non-conductive member 35, such that the antenna 50 can have a high radiation efficiency.

The connecting member 35 can be made of one of a resin, a rubber, and a ceramic.

The resin can be a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC), polyvinyl chloride (PVC). The thermosetting plastic can be selected from a group consisting of an epoxy, and a polyurea resin, and a UV-curing adhesive. The UV-curing adhesive can be an acrylic resin or a polyurethane resin.

The reinforcing member 37 can be made of a metal or a glass fiber.

When the reinforcing member 37 is made of metal, a surface of the reinforcing member 37 has rolling patterns through a knurling process. The rolling patterns can enhance bonding strength among the reinforcing members 37, the substrate 31, the metal sheets 33 and the connecting members 35. Each reinforcing member 37 can have an isolative layer (not shown) through a spraying process or an electrophoresis process. The isolative layer can have a thickness of about 10 μm to about 30 μm. The isolative layer covers the reinforcing members 37, and can prevent the signals of the antenna 50 from being affected by the reinforcing members 37. The isolative layer can be made of an epoxy paint or an insulative paint. The insulative paint can be a polyester paint, a polyurethane paint or a polyamide-imide paint. The main chain of the epoxy paint can includes polyether and diol alcohol, polyether and diamine or polyester and diamine at the main chain of epoxy. The isolative layer has a thickness of about 10 μm to about 15 μm when the isolative layer is made of the epoxy paint, and has a thickness of about 15 μm to about 30 μm when the isolative layer is made of the insulative paint.

When the reinforcing member 37 is made of the glass fiber, a surface of the reinforcing member 37 can have a protective layer through a coating process, a dipping process or an injection process. The protective layer covers the glass fiber, and can prevent the glass fiber from being damaged. The protective layer has a thickness of about 0.02 mm to about 0.5 mm. The protective layer can be made of a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC), polyvinyl chloride (PVC). The thermosetting plastic can be selected from a group consisting of an epoxy, and a polyurea resin, and a UV-curing adhesive. The UV-curing adhesive can be an acrylic resin or a polyurethane resin.

One end of the reinforcing member 37 can successively pass through one groove 3111 formed on the footwall 311, one through-hole 3153 connected with the groove 3111, a cavity 3311 adjacent to the through-hole 3153, another through-hole 3153 facing the through-hole 3153, then the end of the reinforcing member 37 can be partly bended to form a hook 371. Opposite end of the reinforcing member 37 can also successively pass through another groove 3111 formed on the footwall 311 adjacent to the groove 3111, another through-hole 3153 connected with the another groove 3111, the cavity 3311 adjacent to the through-hole 3153, a through-hole 3153 facing the another through-hole 3153, then the opposite end of the reinforcing member 37 can be partly bended to form another hook 371. The hooks 371 can prevent the reinforcing member 37 from being escaped from the grooves 3111, cavities 3311 and the through-holes 3153.

One end of the reinforcing member 37 can successively pass through one groove 3131 formed on the sidewall 313, one through-hole 3151 connected with the groove 3131, a cavity 3335 adjacent to the through-hole 3151, another through-hole 3151 facing the through-hole 3151, then the end of the reinforcing member 37 can be partly bended to form a hook 371. Opposite end of the reinforcing member 37 can also successively pass through another groove 3131 formed on the sidewall 313, another through-hole 3151 connected with the another groove 3131, the cavity 3335 adjacent to the through-hole 3151, a through-hole 3151 facing the another through-hole 3151, then the opposite end of the reinforcing member 37 can be partly bended to form another hook 371. The hooks 371 can prevent the reinforcing member 37 from being escaped from the groove 3131, cavities 3335 and the through-holes 3151.

The non-conductive member 30 can cover at least a portion of the footwall 311 and the sidewalls 313. The non-conductive member 30 can be formed on a bottom of the opening 317. The metal sheets 33, the main bases 318, the reinforcing members 37 and the connecting members 30 all bond with the non-conductive member 39.

The non-conductive member 39 can be made of a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC), polyvinyl chloride (PVC). The thermosetting plastic can be selected from a group consisting of an epoxy, and a polyurea resin, and a UV-curing adhesive. The UV-curing adhesive can be an acrylic resin or a polyurethane resin.

It is to be understood that the non-conductive member 39 can be also made of a glass or a ceramic.

The protective layer (not shown) can be formed on the housing 30 through a spraying process, an anodic oxidation process, or an electrophoresis process. The protective layer has a thickness of about 10 μm to about 15 μm.

Figure 9:
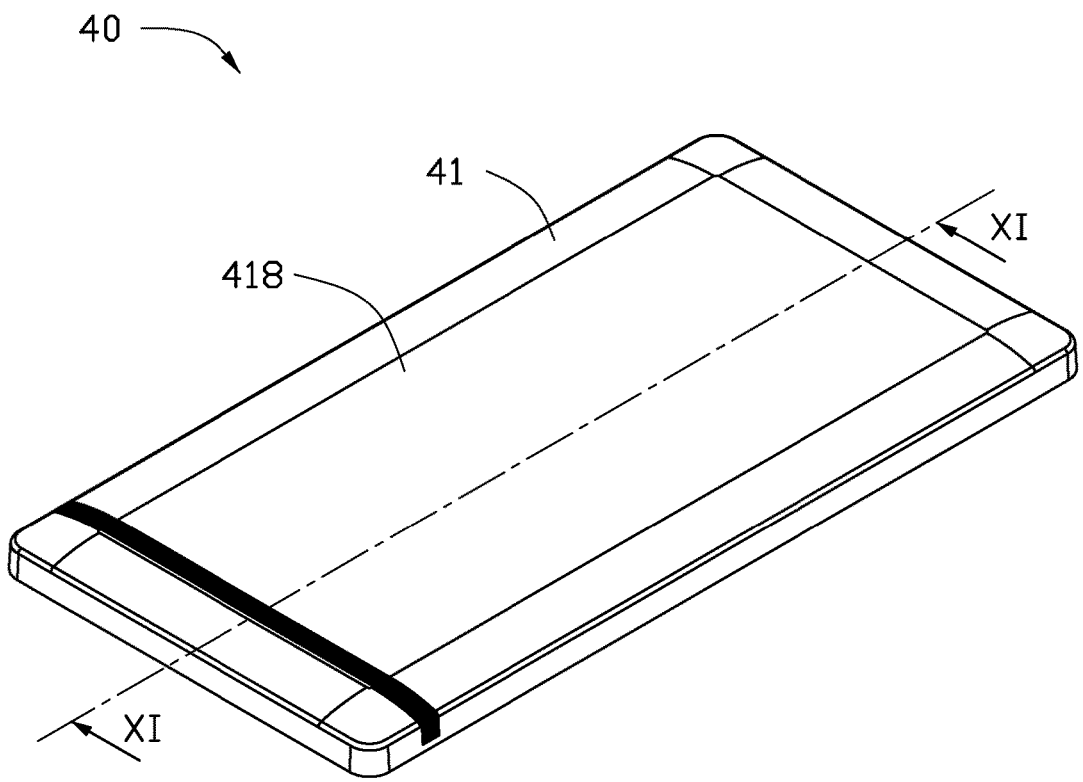
FIG. 9 is an isometric view of a housing of the electronic device shown in FIG. 1, according to a second exemplary embodiment.
Figure 10:
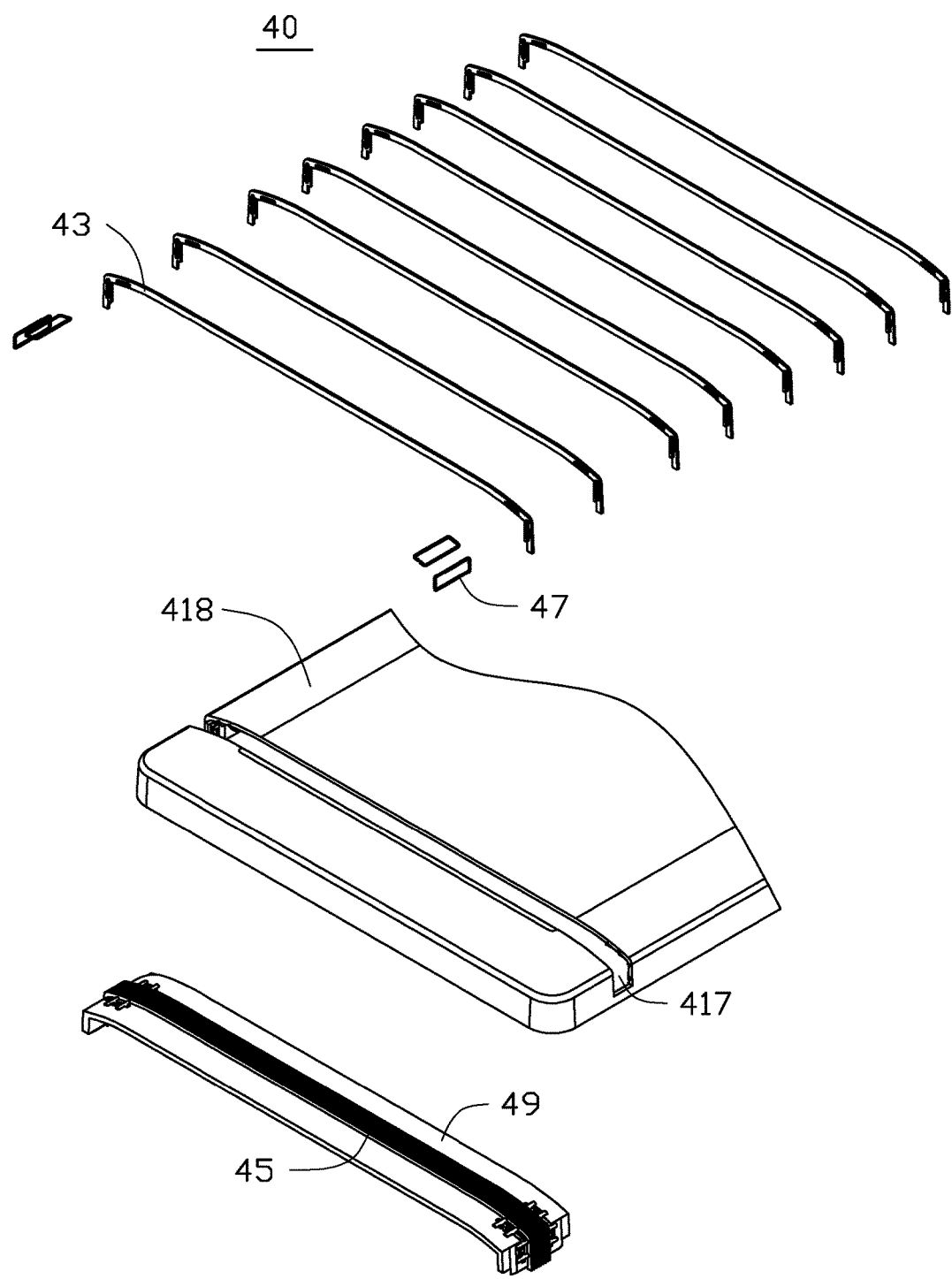
FIG. 10 is an exploded, isometric view of the housing shown in FIG. 9.
Figure 11:
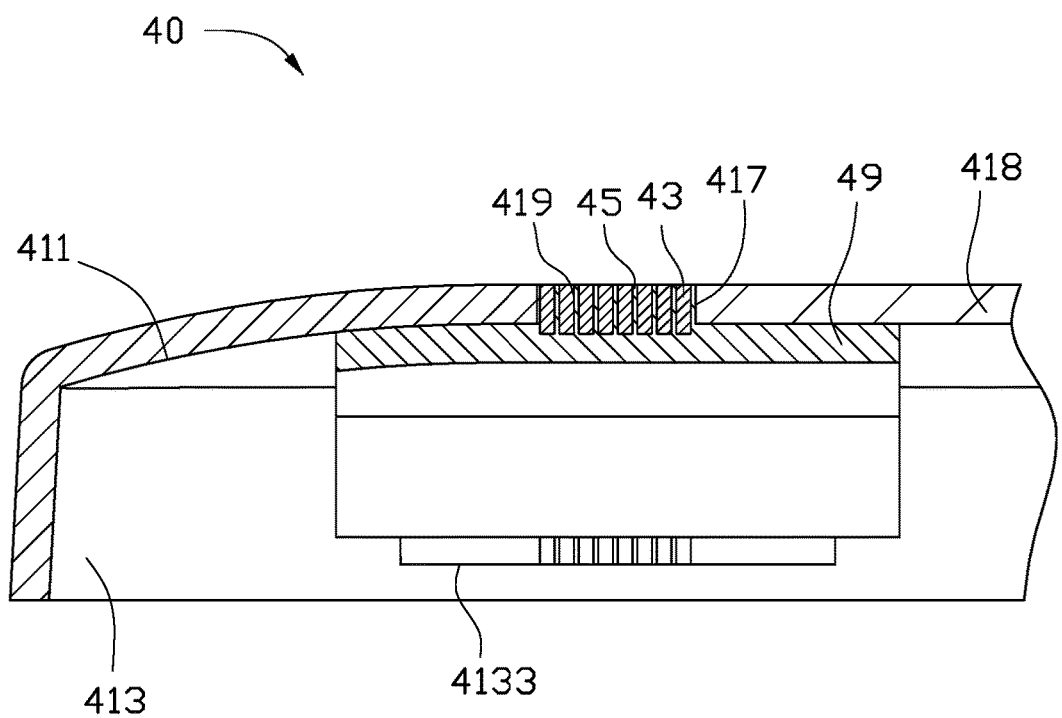
FIG. 11 is a cross-sectional view of the housing along line XI-XI of FIG. 9.

FIGS. 9-11 illustrate a housing 40 according to a second exemplary embodiment. The housing 40 includes a substrate 41, a plurality of metal sheets 43, a plurality of connecting members 45, a plurality of reinforcing members 47 positioned in the substrate 41 and the metal sheets 43, and a non-conductive member 49. The substrate 41 includes a main base 418, a footwall 411, at least one sidewall 413 having an accommodating groove 4133, and an opening 317. The connecting members 45 are respectively positioned in gaps 419 between each two adjacent metal sheets 43, and between the main base 418 and the metal sheet 43 adjacent to the main base 418, such that the metal sheets 43 and the main base 418 can be bonded together.

The difference between the housing 40 of the second exemplary embodiment and the housing 30 of the first exemplary embodiment is that the opening 417 can be positioned within the substrate 41, and the opening 417 cannot run through at least one end of the metal substrate 41 along a direction of the metal sheets 43 parallel to the main base 418. The number of the main base 418 can be one.

Figure 12:
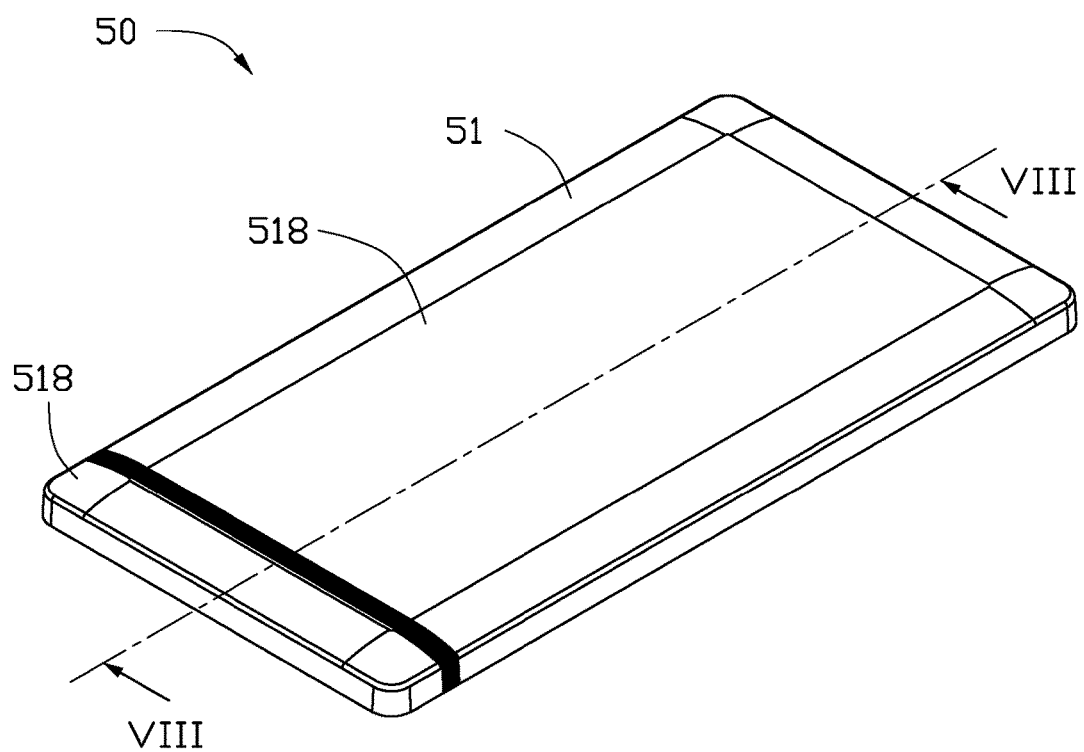
FIG. 12 is an isometric view of a housing of the electronic device shown in FIG. 1, according to a third exemplary embodiment.
Figure 13:
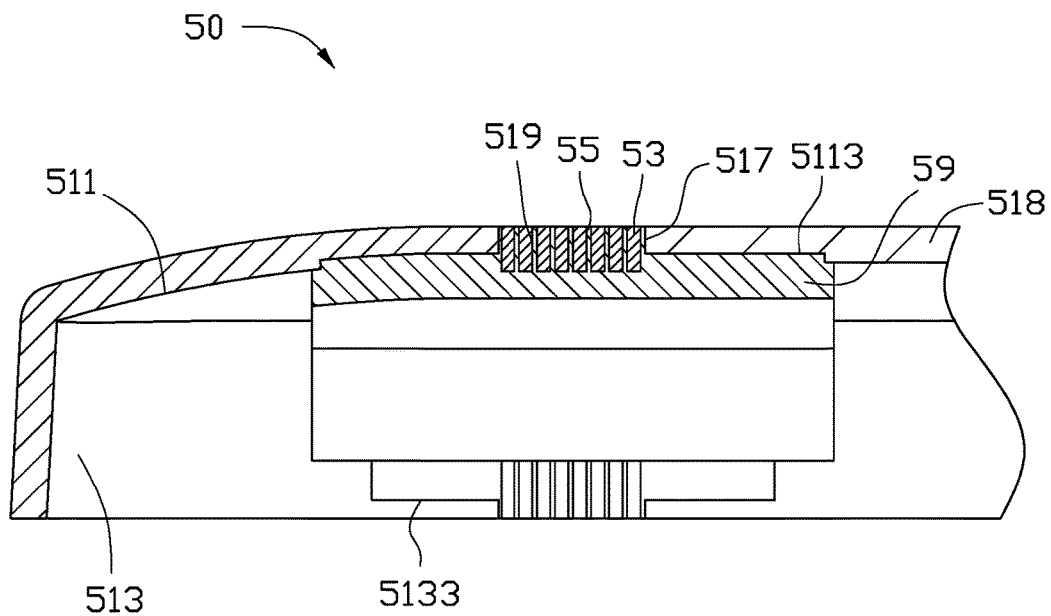
FIG. 13 is a cross-sectional view of the housing along line XII-XII of FIG. 12.

FIGS. 12-13 illustrate a housing 50 according to a third exemplary embodiment. The housing 50 includes a substrate 51, a plurality of metal sheets 53, a plurality of connecting members 55, a plurality of reinforcing members (not shown) positioned in the substrate 51 and the metal sheets 53, and a non-conductive member 59. The substrate 51 includes two main bases 518, a footwall 511, at least one sidewall 513 having an accommodating groove 5133, and an opening 517. The connecting members 55 are respectively positioned in gaps 519 between each two adjacent metal sheets 53, and between the main bases 518 and the metal sheets 53 adjacent to the main bases 518, such that the metal sheets 53 and the main bases 518 can be bonded together.

The difference between the housing 50 of the third exemplary embodiment and the housing 30 of the first exemplary embodiment is that a thickness of the footwall 513 is more than 0.5 mm. Preferably, the thickness of the footwall 513 is about 0.8 mm to about 1.0 mm. Sections of a portion of a surface of the footwall 513 can be thinned to form a groove 5113 by a thinning process. The non-conductive member 59 can be received in the groove 5113. The thickness of the footwall 513 corresponding to the groove 53113 can be about 0.3 mm to about 0.5 mm. The thinning process can be carried out by a computer number control technology (CNC). It is to be understood that the non-conductive member 59 can also cover a periphery of groove 5113 to enhance the bonding strength between the non-conductive member 59 and the footwall 511.

Figure 14:
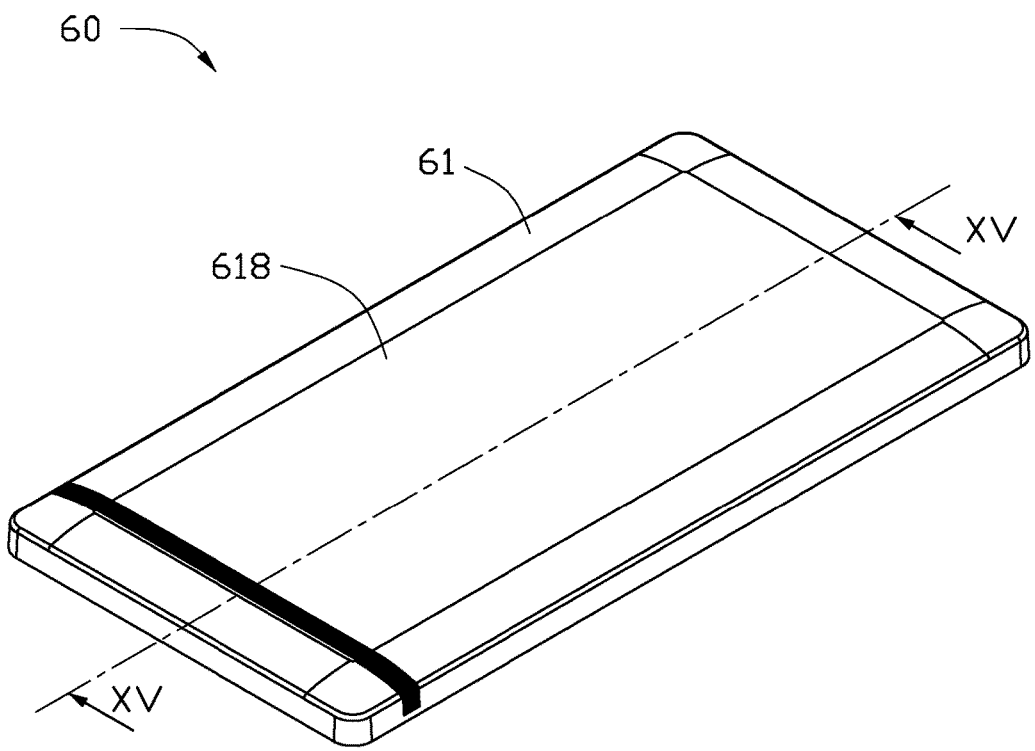
FIG. 14 is an isometric view of a housing of the electronic device shown in FIG. 1, according to a third exemplary embodiment.
Figure 15:
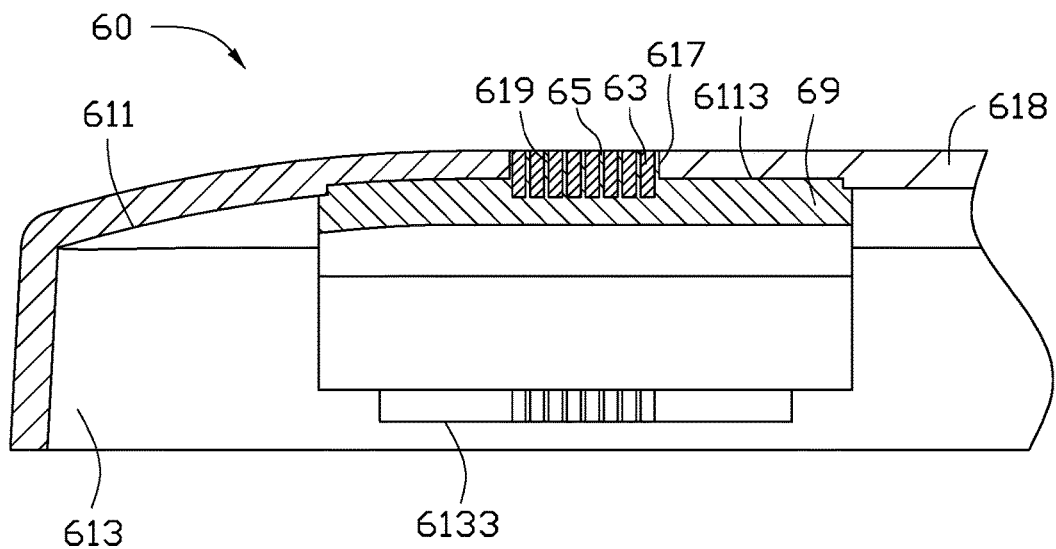
FIG. 15 is a cross-sectional view of the housing along line XV-XV of FIG. 14.

FIGS. 14-15 illustrate a housing 60 according to a fourth exemplary embodiment. The housing 60 includes a substrate 61, a plurality of metal sheets 63, a plurality of connecting members 65, a plurality of reinforcing members (not shown) positioned in the substrate 61 and the metal sheets 63, and a non-conductive member 69. The substrate 61 includes a main base 618, a footwall 611, at least one sidewall 613 having an accommodating groove 6133, and an opening 617. The connecting members 65 are respectively positioned in gaps 619 between each two adjacent metal sheets 63, and between the main base 618 and the metal sheet 63 adjacent to the main base 618, such that the metal sheets 63 and the main bases 618 can be bonded together.

The difference between the housing 60 of the fourth exemplary embodiment and the housing 40 of the second exemplary embodiment is that a thickness of the footwall 611 is more than 0.5 mm. Preferably, the thickness of the footwall 611 is about 0.8 mm to about 1.0 mm. Sections of a portion of a surface can be thinned to form a groove 6113 by a thinning process. Non-conductive member 69 can be received in the groove 6113. A thickness of the footwall 611 corresponding to the groove 6113 can be about 0.3 mm to about 0.5 mm. The thinning process can be carried out by a CNC technology. It is to be understood that the non-conductive member 69 can also cover a periphery of groove 6113 to enhance the bonding strength between the non-conductive member 69 and the footwall 611.

Figure 16:
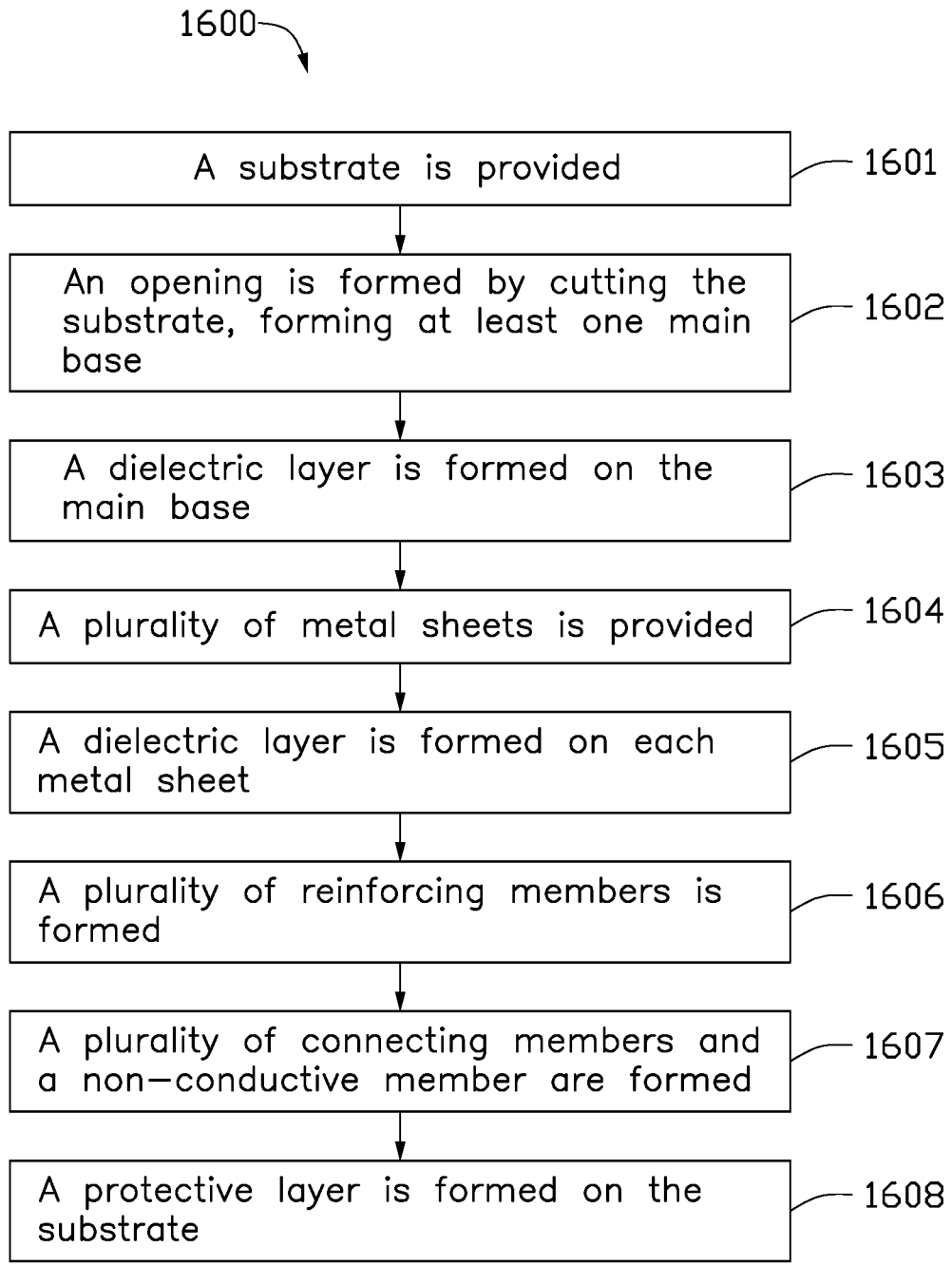
FIG. 16 is a flow chart of a method for making a housing in accordance with an exemplary embodiment.

Referring to FIG. 16, a flowchart is presented in accordance with an example embodiment. The method 1600 is provided by way of example, as there are a variety of ways to carry out the method. The method 1600 described below can be carried out using the configurations illustrated in FIGS. 1-8, for example, and various elements of these figures are referenced in explaining example method 1600. Each block shown in FIG. 16 represents one or more processes, methods or subroutines, carried out in the example method 1600. Furthermore, the order of blocks is illustrative only and the order of the blocks can change according to the present disclosure. Additional blocks can be added or fewer blocks can be utilized, without departing from this disclosure. The example method 1600 for making the housing 30 can begin at block 1601.

At block 1601, a substrate 31 having a desired three-dimensional shape of the housing 30 is provided. The substrate 31 can be made by casting, punching, or computer number control. The substrate 31 can be made of a metal which can be selected from a group consisting of stainless steel, aluminum, aluminum alloy, magnesium, magnesium alloy, titanium, titanium alloy, copper and copper alloy.

The substrate 31 includes a footwall 311, two opposite sidewalls 313 and two pairs of two opposite fastening structures 315. The sidewalls 313 are respectively located at two opposite sides of the footwall 311. The two pairs of two opposite fastening structures 315 are respectively located at two opposite sides of the substrate 31. In at least one exemplary embodiment, the thickness of the footwall 311 and the sidewalls 313 are all less than 0.5 mm; preferably, the thickness of the footwall 311 and the sidewalls 313 can be about 0.3 mm to about 0.5 mm.

The two opposite sides of the footwall 311 both has a plurality of grooves 3111 corresponding to the fastening structures 315. In at least one exemplary embodiment, the number of the grooves 3111 can be eight.

In at least one exemplary embodiment, a surface of each sidewall 313 forms an accommodating groove 3133, the non-conductive member 39 can cover at least a portion of the footwall 311 and the sidewalls 313, and can be positioned in the accommodating grooves 3133. Portions of the sidewall 313 corresponding to the accommodating grooves 3133 can have a thickness of about 0.2 mm to about 0.4 mm.

It is to be understood that the location, the shape and the dimension of the at least a portion can be designed according to the housing 30.

The sidewall 313 also has a plurality of grooves 3131 corresponding to the fastening structures 315. In at least one exemplary embodiment, the number of the grooves 3131 can be eight.

In alternative embodiments, a surface of each sidewall 313 does not form an accommodating groove 3133, the non-conductive member 39 can cover at least a portion of the footwall 311 and the sidewalls 313.

One end of each fastening structure 315 is located at one sidewall 313, the opposite end of the fastening structure 315 is located at the footwall 311 along a direction extending from the sidewall 313 to the footwall 311. Each end of the fastening structures 315 located at the sidewall 313 has two through-holes 3151 connected with groove 3131, and each end of the fastening structures 315 located at the footwall 311 has two through-holes 3153 connected with groove 3111. In at least one exemplary embodiment, the number of the through-holes 3151, 3153 can be eight. The reinforcing members 37 can be positioned in the grooves 3111, 3131 and the through-holes 3151, 3153.

At block 1602, the substrate 31 is cut off, forming an opening 317. The substrate 31 can be spaced by the opening 317 and forms at least one main base 318. In at least one exemplary embodiment, the substrate 31 can be cut off by a computer numerical control process, or a laser cutting technology.

In at least one exemplary embodiment, the substrate 31 can be spaced by the opening 317 and forms two main bases 318.

At block 1603, a dielectric layer (not shown) is formed on a surface of each main base 318 through a surface treatment process. The dielectric layer has a thickness of about 8 μm to about 25 μm. The surface treatment process can be carried out by either of the following two methods:

In a first method, the surface treatment can be carried out in a sulfuric acid solution having a concentration of about 160-220 g/L, with the main bases 318 being an anode, and a stainless steel board being a cathode. The voltage between the anode and the cathode is about 10 V to about 15 V. The temperature of the sulfuric acid is about 16° C. to about 18° C. The surface treatment process can last for about 30 minutes to about 45 minutes to form the dielectric layers on the main bases 318. The dielectric layer has a thickness of about 10 μm to about 15 μm. The dielectric layer has a plurality of pores (not shown).

In a second method, the dielectric layer is formed by spraying insulative paint onto the surface of the metal bases 318. The dielectric layer has a thickness of about 15 μm to about 25 μm. The insulative paint can be a polyester paint, a polyurethane paint or a polyamide-imide paint.

At block 1604, a plurality of metal sheets 33 having a desired three-dimensional shape of the housing 30 is provided. The metal sheets 33 can be made by casting, punching, or computer number control. The metal sheets 33 can be made of a metal which can be selected from a group consisting of stainless steel, aluminum, aluminum alloy, magnesium, magnesium alloy, titanium, titanium alloy, copper and copper alloy. Each metal sheet 33 has a width of about 0.15 mm to about 1.0 mm along a direction from a connecting member 35 located at one side of a metal sheet 33 to an adjacent connecting member 35 located at the opposite side of the metal sheet 33.

Each metal sheet 33 includes an end wall 331, and two sidewalls 333, the sidewalls 333 are perpendicularly connected with two opposite ends of the end wall 331, respectively.

Two opposite ends of the end wall 331 both have a cavity 3311. The end wall 331 has a width of about 0.8 mm to about 1.0 mm perpendicular to a direction from a connecting member 35 located at one side of a metal sheet 33 to an adjacent connecting member 35 located at the opposite side of the metal sheet 33.

Each sidewall 333 includes a bending member 3331 and an extending member 3333.

The two opposite ends of each end wall 331 bend along a direction perpendicular to the end wall 331, forming the bending members 3331. Each bending member 3331 has a cavity 3335. Each bending member 3331 has a width of about 0.8 mm to about 1.0 mm perpendicular to a direction from a connecting member 35 located at one side of a metal sheet 33 to an adjacent connecting member 35 located at the opposite side of the metal sheet 33.

Each bending member 3331 extends away from the end wall 331, forming the extending member 3333. Each extending member 3333 has a width of about 0.3 mm to about 0.5 mm perpendicular to a direction from a connecting member 35 located at one side of a metal sheet 33 to an adjacent connecting member 35 located at the opposite side of the metal sheet 33. The width of the extending members 333 is equal to the thickness of the sidewall 313.

At block 1605, a dielectric layer (not shown) is formed on each metal sheet 33 through a surface treatment process. The dielectric layer has a thickness of about 8 μm to about 25 μm. The surface treatment process can be carried out by either of the following two methods:

In a first method, the surface treatment can be carried out in a sulfuric acid solution having a concentration of about 160-220 g/L, with the metal sheets 33 being an anode, and a stainless steel board being a cathode. The voltage between the anode and the cathode is about 10 V to about 15 V. The temperature of the sulfuric acid is about 16° C. to about 18° C. The surface treatment process can last for about 30 minutes to about 45 minutes to form the dielectric layer on the metal sheets 33. The dielectric layer has a thickness of about 10 μm to about 15 μm. The dielectric layer has a plurality of pores (not shown).

In a second method, the dielectric layer is formed by spraying insulative paint onto the surface of the main sheets 33. The dielectric layer has a thickness of about 15 μm to about 25 μm. The insulative paint can be a polyester paint, a polyurethane paint or a polyamide-imide paint.

At block 1606, a plurality of reinforcing members 37 is formed by any of the following four methods.

In a first method, a metal wire is provided. Rolling patterns can be formed on a surface of the metal wire through a knurling process. Then, the metal wire can be cut off to form a plurality of reinforcing members 37. An isolative layer can be formed on each reinforcing member 37 through an electrophoresis process or a spraying process. The isolative layer has a thickness of about 20 μm to about 30 μm. The reinforcing members 37 coated with the isolative layer would not affect signals of the antenna 50.

The electrophoresis process can be carried out in an electrophoresis solution having a temperature of about 30-37° C., with the reinforcing members 37 being an anode, and a stainless steel board being a cathode. The voltage between the anode and the cathode is about 70 V to about 90 V. The surface treatment process can last for about 20 seconds to about 44 seconds to form the isolative layers. The isolative layer has a thickness of about 10 μm to about 15 μm. The electrophoresis solution includes electrophoresis paint and water with a volume ration of about 3-5:4-6. The electrophoresis paint can be an epoxy paint, the main chain of the epoxy paint can have polyether and diol alcohol, polyether and diamine or polyester and diamine.

The isolative layer can be also formed by spraying insulative paint on the metal wire. The insulative paint can be a polyester paint, a polyurethane paint or a polyamide-imide paint. The isolative layer has a thickness of about 15 μm to about 30 μm.

It is to be understood that the metal wire can be replaced by metal rod.

In a second method, a glass fiber is provided. The glass fiber is put into a mold (not shown). Liquid resin can be filled into the mold and cover the glass fiber, forming the reinforcing member 37 having an isolation layer, the isolative layer can protect the reinforcing member 37 from been damaged. The isolative layer has a thickness of about 0.02 mm to about 0.5 mm.

In a third method, a glass fiber is provided. The glass fiber can be dipped in a molten resin solution, resin covers the glass fiber, then the glass fiber can be put out off the solution, and dried, forming the reinforcing member 37 having a protective layer. The resin can be dried in an oven, at room temperature, or by a UV radiation. The protective layer has a thickness of about 0.02 mm to about 0.5 mm.

In a fourth method, a glass fiber is provided. Molten resin can be coated on the glass fiber, and then the molten resin can be dried to form a protective layer on the glass fiber. The resin can be dried in an oven, at room temperature, or by a UV radiation. The protective layer has a thickness of about 0.02 mm to about 0.5 mm.

The protective layer can be made of a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC), polyvinyl chloride (PVC). The thermosetting plastic can be selected from a group consisting of an epoxy, and a polyurea resin, and a UV-curing adhesive. The UV-curing adhesive can be an acrylic resin or a polyurethane resin.

The glass fiber can be cut off to form a plurality of reinforcing members 37.

At block 1607, a plurality of connecting members 35 and a non-conductive member are formed through an injection process.

The main bases 318 and the metal sheets 33 can be placed into a mold (not shown), the metal sheets 33 are all sandwiched between the two main bases 318. Each two adjacent metal sheets 311 having the dielectric layer, and each main base 318 having the dielectric layer and the metal sheet 311 adjacent to the main base 318 can be spaced by gaps 319.

One end of the reinforcing member 37 can successively pass through one groove 3111 formed on the footwall 311, one through-hole 3153 connected with the groove 3111, a cavity 3311 adjacent to the through-hole 3153, another through-hole 3153 facing the through-hole 3153, and then the end of the reinforcing member 37 can be partly bended to form a hook 371. Opposite end of the reinforcing member 37 can also successively pass through another groove 3111 formed on the footwall 311 adjacent to the groove 3111, another through-hole 3153 connected with the another groove 3111, the cavity 3311 adjacent to the through-hole 3153, a through-hole 3151 facing the another through-hole 3153, and then the opposite end of the reinforcing member 37 can be partly bended to form another hook 371. One end of another reinforcing member 37 can successively pass through one groove 3131 formed on the sidewall 313, one through-hole 3151 connected with the groove 3131, a cavity 3335 adjacent to the through-hole 3151, another through-hole 3151 facing the through-hole 3151, and then the end of the reinforcing member 37 can be partly bended to form a hook 371. Opposite end of the another reinforcing member 37 can also successively pass through another groove 3131 formed on the sidewall 313 adjacent to the groove 3131, another through-hole 3151 connected with the groove 3131, the cavity 3335 adjacent to the through-hole 3151, a through hole 3151 facing the another through-hole 3151, and then the opposite end of the reinforcing member 37 can be partly bended to form another hook 371. The hooks 371 can prevent the reinforcing members 37 from being escaped from the groove 3131, cavities 3331 and the through-holes 3151. The injection temperature can be about 290° C. to about 320° C., the injection pressure can be about 2 MPa to about 4 MPa. Liquid resin can be filled into the gaps 319, the grooves 3111, 3131, the through-holes 3151, 3153, cavities 3311, 3335, and cover the fastening structure 315 and reinforcing members 37. After the resin is cold, the resin can bond the metal sheets 33, the main bases 318 and the reinforcing members 37 together, the resin received in the gaps 319 forms a plurality of connecting members 35. Each gap 319 and each connecting member 35 can both have a width of about 0.02 mm to about 0.7 mm along a direction from an adjacent non-conductive element 33 located at one side of metal sheet 311 to another adjacent non-conductive element 33 located at an opposite side of the metal sheet 311. Signals of the antenna 50 can pass through the connecting members 35, such that the antenna 50 has a high radiation efficiency.

The connecting member 35 can be made of a resin, a rubber, or a ceramic.

The resin can be a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC), polyvinyl chloride (PVC). The thermosetting plastic can be selected from a group consisting of an epoxy, and a polyurea resin, and a UV-curing adhesive. The UV-curing adhesive can be an acrylic resin or a polyurethane resin.

It is to be understood, the metal sheets 33 and the main bases 318 do not form the dielectric layer, and gaps 319 between each two adjacent metal sheets 33 can be about 0.02 mm to about 0.7 mm along a direction from a connecting member 35 located at one side of a metal sheet 33 to an adjacent connecting member 35 located at the opposite side of the metal sheet 33. Gaps 319 between the main bases 318 and the metal sheets 33 adjacent to the main bases 318 can be about 0.02 mm to about 0.7 mm along a direction from a connecting member 35 located at one side of a metal sheet 33 to an adjacent connecting member 35 located at the opposite side of the metal sheet 33. The connecting member 35 can be received in the gaps 319 respectively, and directly connected with the metal sheets 33 and the main bases 318, such that each two adjacent metal sheets 33, and the main bases 318 and the metal sheets 33 adjacent to the main bases 318 can be bonded together.

It is to be understood that, when the metal sheets 33 and the main bases 318 do not have the dielectric layer, the substrate 31 can be coupled with the antenna 50, the substrate 31 can be a part of the antenna 50 assembly of the electronic device 100, signals of the antenna 50 can pass through the gaps 319, such that the antenna 50 can have a high radiation efficiency.

In alternative embodiments, when the metal sheets 33 and the main bases 318 do not have the dielectric layer, the substrate 31 is not coupled with the antenna 50, such that the main bases 31 is not used as a part of the antenna 50 assembly of the electronic device 100, signals of the antenna 50 can pass through the gaps 319 and the connecting member 35, such that the antenna 50 can have a high radiation efficiency.

During the injection process, liquid resin can cover at least a portion of the footwall 311 and sidewalls 313, and fill the accommodating groove 3133. After the resin is cold, the non-conductive members 39 are formed, the non-conductive member 39 can bond with the metal sheets 33, the connecting members 35, the main bases 318 and the reinforcing members 37. The non-conductive member 39 can be formed on a bottom of the opening 317. The non-conductive member 39 can enhance bonding strength between the metal sheets 33 and the main bases 318.

It is to be understood that when the sidewalls 313 do not have accommodating groove 3133, the non-conductive member 39 is formed on at least a portion of the footwall 311 and the sidewalls 313.

The location, the shape, and the dimension of the at least a portion can be designed according to the housing 30.

The non-conductive member 39 can be made of a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC), polyvinyl chloride (PVC). The thermosetting plastic can be selected from a group consisting of an epoxy, and a polyurea resin, and a UV-curing adhesive. The UV-curing adhesive can be an acrylic resin or a polyurethane resin.

It is to be understood that the non-conductive member 39 can be also made of a glass or a ceramic.

At block 1608, a protective layer (not shown) is formed on the substrate 31 through a surface treatment process. The surface treatment process can be carried out by any of the following three methods.

In a first method, the protective layer is formed by an anodic oxidation coloring process. The anodic oxidation coloring process is carried out in a sulphuric acid solution having a concentration of about 160 g/L to about 220 g/L, with the substrate 31 being an anode, and a stainless steel board being a cathode. The voltage between the anode and the cathode is about 10 V to about 15 V. The temperature of the sulphuric acid is about 16° C. to about 18° C. The anodic oxidation coloring process can last for about 30 minutes to about 45 minutes to form the protective layer having a thickness of about 10 μm to about 15 μm. The protective layer has a plurality of pores (not shown). Then, the substrate 31 is dipped into a dyeing solution containing coloring agent at a temperature of about 30° C. to about 50° C. The coloring agent has a concentration of about 3 g/L to about 10 g/L. The dipping time can be about 1 minute to about 2 minutes. The coloring agent is absorbed into the pores of the protective layer, such that the protective layer can have color. The coloring agent is a dark organic coloring agent or a dark inorganic coloring agent. The protective layer containing coloring agent should be sealed to fix the coloring agent in the pores. The sealing treatment can be a boiling water sealing process, a steam sealing process, a nickel acetate sealing process, a potassium dichromate sealing process, a nickel sulfate sealing process, stearic acid sealing process, or a cold sealing process.

In a second method, the protective layer is formed by an electrophoresis process. The electrophoresis process is carried out in an electrophoresis solution at a temperature of about 30° C. to about 37° C., with the substrate 31 being an anode, and a stainless steel board being a cathode. The voltage between the anode and the cathode is about 70 V to about 90 V. The electrophoresis process may last for about 20 seconds to about 44 seconds to form the protective layer having a thickness of about 10 μm to about 15 μm. The electrophoresis solution includes electrophoresis paint and water with a volume ratio of about 3-5:4-6. The electrophoresis paint can be an epoxy electrophoresis paint. The main chain of the epoxy electrophoresis paint can have polyether and dual alcohol, polyether and dual amine, or polyester and dual alcohol.

It is to be understood that the protective layer formed by the electrophoresis process or the anodic oxidation coloring process can cover an area of the substrate 31. As the width of each connecting member 35 is very small, it is hard to find out the connecting members 35 located in the substrate 31, such that the housing 30 can have an entire metallic appearance.

In a third method, the protective layer is formed by spraying paint onto the surface of the substrate 31 by a spraying gun (not shown). Then, the substrate 31 is put in a dryer to be dried, such that the protective layer having a thickness of about 10 μm to about 15 μm is formed on the entail surface of the substrate 31. As the paint can cover the entire surface of the substrate 31 and the connecting member 35, the substrate 31 can have an entire metallic appearance.

A method of making the housing 40 according to a second exemplary embodiment is difference from the method of making the housing 30 according to the first exemplary embodiment. The difference is that opening 417 can be positioned within the substrate 41, and the opening 417 cannot run through at least one end of the metal substrate 41 along a direction of the metal sheets 43 parallel to the main base 418. The number of the main base 418 can be one.

Figure 17:
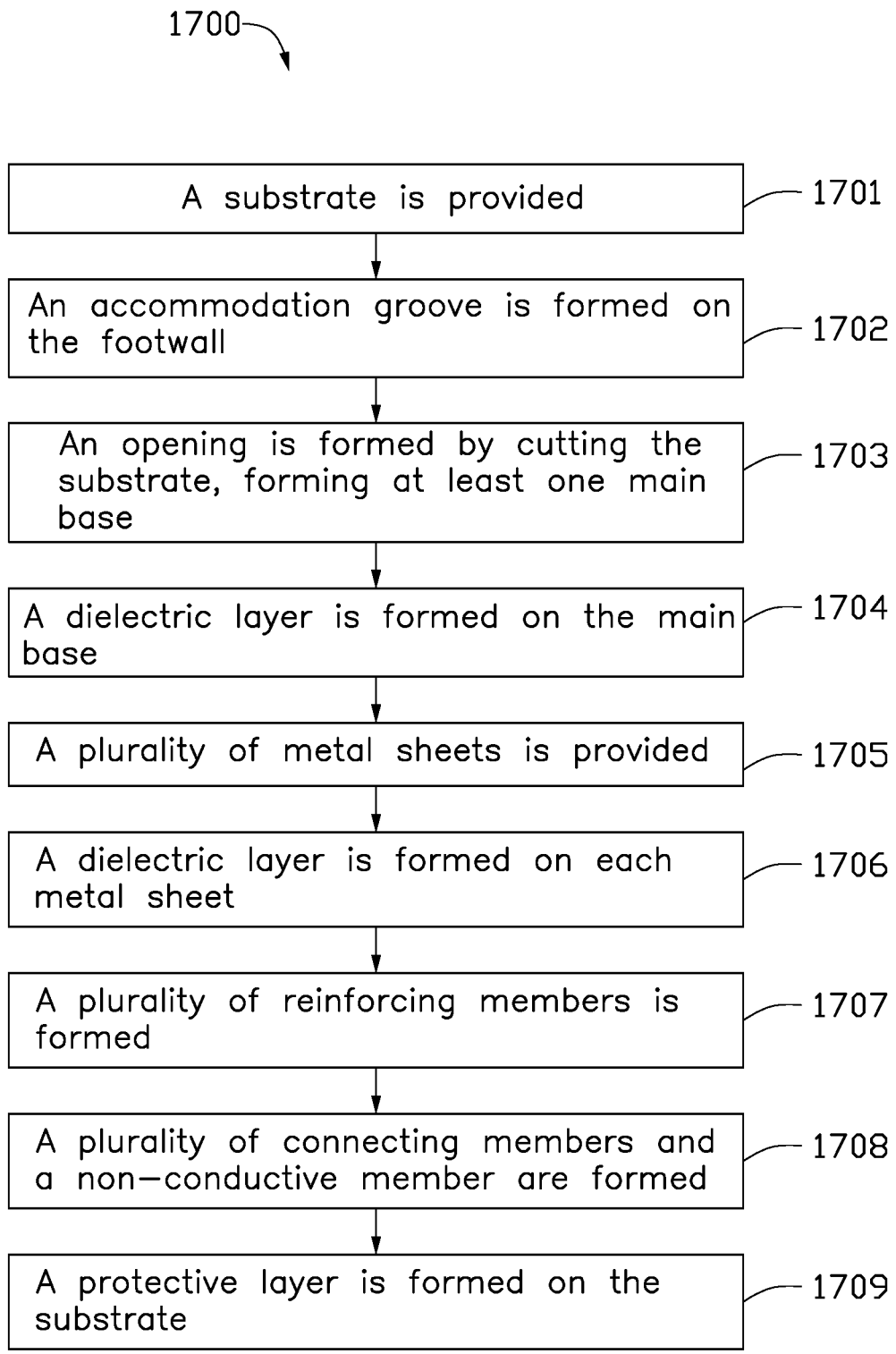
FIG. 17 is a flow chart of a method for making a housing in accordance with another exemplary embodiment.

Referring to FIG. 17, a flowchart is presented according to another exemplary embodiment. The method 1700 is provided by way of example, as there are a variety of ways to carry out the method. The method 1700 described below can be carried out using the configurations illustrated in FIGS. 12-13, for example, and various elements of these figures are referenced in explaining method 1700. Each block shown in FIG. 17 represents one or more processes, methods or subroutines, carried out in the method 1700. Furthermore, the order of blocks is illustrative only and the order of the blocks can change according to the present disclosure. Additional blocks can be added or fewer blocks can be utilized, without departing from this disclosure. The method 1700 for making the housing 50 can begin at block 1701.

At block 1701, a substrate 51 having a desired three-dimensional shape of the housing 50 is provided. The substrate 51 can be made of a metal which can be selected from a group consisting of stainless steel, aluminum, aluminum alloy, magnesium, magnesium alloy, titanium, titanium alloy, copper and copper alloy. In at least one exemplary embodiment, a thickness of the substrate 51 is more than 0.5 mm. Preferably, the thickness of the substrate 51 is about 0.8 mm to about 1.0 mm.

The substrate 51 includes a footwall 511, two opposite sidewall 513 and two pairs of two opposite fastening structures (not shown). The sidewalls 513 are respectively located at two opposite sides of the footwall 511. The two pairs of two opposite fastening structures are respectively located at two opposite sides of the substrate 51.

In at least one exemplary embodiment, a surface of each sidewall 513 forms a groove 5133, the non-conductive member 59 can cover at least a portion of the footwall 511 and the groove 5133.

At block 1702, an accommodation groove 5113 is formed on the footwall 311 by a thinning process. Portions of the footwall 511 corresponding to the groove 5113 can have a thickness of about 0.3 mm to about 0.5 mm. The thinning process can be carried out by a CNC technology.

At block 1703, the substrate 51 is cut off, forming an opening 517. The substrate 51 can be spaced by the opening 517 and forms at least one main base 518. In at least one exemplary embodiment, the substrate 51 can be cut off by a computer numerical control process, or a laser cutting technology.

In at least one exemplary embodiment, the substrate 51 can be spaced by the opening 517 and forms two main bases 518.

At block 1704, a dielectric layer (not shown) is formed on a surface of each main base 518 through a surface treatment process. The dielectric layer has a thickness of about 8 μm to about 25 μm. The surface treatment process is similar with the surface treatment process as illustrated at block 1603.

At block 1705, a plurality of metal sheets 53 having a desired three-dimensional shape of the housing 50 is provided. The metal sheets 53 can be made by casting, punching, or computer number control. The metal sheets 53 can be made of a metal which can be selected from a group consisting of stainless steel, aluminum, aluminum alloy, magnesium, magnesium alloy, titanium, titanium alloy, copper and copper alloy. Each metal sheet 53 has a width of about 0.15 mm to about 1.0 mm along a direction from a connecting member 55 located at one side of a metal sheet 53 to an adjacent connecting member 55 located at the opposite side of the metal sheet 53.

At block 1706, a dielectric layer (not shown) is formed on a surface of each main sheet 53 through a surface treatment process. The dielectric layer has a thickness of about 8 μm to about 25 μm. The surface treatment process is similar with the surface treatment process as illustrated at block 1605.

At block 1707, a plurality of reinforcing members 57 (not shown) is formed. The method of making the reinforcing member 57 of housing 50 is similar with method of making the reinforcing member of housing 30 as illustrated at block 1606. The reinforcing members can be position in the substrate 51.

At block 1708, a plurality of connecting members 55 and a non-conductive member 59 are formed. The method of making the connecting member 55 and a non-conductive member 59 of housing 50 is similar with method of making the connecting member 35 and a non-conductive member 39 of housing 30 as illustrated at block 1607.

The connecting member 35 can be positioned in the gaps 519 respectively, and directly connected with the metal sheets 53 and the main bases 518, such that each two adjacent metal sheets 53, and the main bases 518 and the metal sheets 53 adjacent to the main bases 518 can be bonded together.

The non-conductive member 59 can bond with the metal sheets 53, the connecting members 55, the main bases 518 and the reinforcing members 57. The non-conductive member 59 can be formed on a bottom of the opening 517. The non-conductive member 59 can enhance the bonding between the metal sheets 53 and the main bases 518.

At block 1709, a protective layer (not shown) is formed on the substrate 51 through a surface treatment process, forming the housing 50. The surface treatment process is similar with the surface treatment process as illustrated at block 1608.

A method of making the housing 60 according to a fourth exemplary embodiment is difference from the method of making the housing 50 according to the third exemplary embodiment. The difference is that opening 617 can be positioned within the substrate 61, and the opening 617 cannot run through at least one end of the metal substrate 61 along a direction of the metal sheets 63 parallel to the main base 618. The number of the main base 618 can be one.

It is to be understood, however, that even through numerous characteristics and advantages of the present disclosure have been set forth in the foregoing description, together with details of assembly and function, the disclosure is illustrative only, and changes may be made in detail, including in the matters of shape, size, and arrangement of parts within the principles of the disclosure to the full extent indicated by the broad general meaning of the terms in which the appended claims are expressed.

What is claimed is:

1. A method of making a housing, the method comprising:
   providing a substrate;
   cutting the substrate into two main bases which are spaced apart by an opening;
   providing a plurality of metal sheets, each of the plurality of metal sheets defining a longitudinal sheet axis, and a plurality of reinforcing members, each of the plurality of reinforcing members defining a longitudinal member axis;
   placing the plurality of metal sheets, the plurality of reinforcing members, and the main base into a mold, the plurality of metal sheets being positioned in the opening;
   forming a plurality of gaps, wherein each adjacent two of the plurality of metal sheets, each of the main bases and one of the metal sheets adjacent to each of the main bases are spaced apart by one of the plurality of gaps;
   locating the plurality of reinforcing members in the metal sheets and the main base, wherein the longitudinal member axis of each of the plurality of reinforcing members is perpendicular to the longitudinal sheet axis of each of the plurality of metal sheets; and
   filling liquid resin into each of the plurality of gaps and covering the plurality of reinforcing members with the liquid resin, thereby bonding the plurality of metal sheets, the main base, and the plurality of reinforcing members together.

2. The method as claimed in claim 1, wherein the substrate comprises a footwall and two opposite sidewalls, the sidewalls are respectively located at two opposite sides of the footwall, the method further comprises thinning sections of a portion of the footwall to form an accommodating groove on the footwall before cutting the substrate, and positioning a non-conductive member in the accommodating groove on the footwall.

3. The method as claimed in claim 2, wherein the footwall has a thickness of 0.3 mm to 0.5 mm, each sidewall has a thickness of 0.2 mm to 0.4 mm.

4. The method as claimed in claim 3, further comprising a step of forming a dielectric layer on the main base and each metal sheet.

5. The method as claimed in claim 4, wherein the dielectric layer has a thickness of 8 μm to 25 μm.

6. The method as claimed in claim 3, wherein the liquid resin filled in each of the plurality of gaps forms a plurality of connecting members.

7. The method as claimed in claim 6, wherein each of the plurality of metal sheets comprises an end wall and two sidewalls, the two sidewalls are perpendicularly connected with two opposite ends of the end wall respectively, two opposite ends of the end wall both have a cavity, the end wall has a width of 0.8 mm to 1.0 mm perpendicular to a direction from a connecting member located at one side of a metal sheet to an adjacent connecting member located at the opposite side of the metal sheet.

8. The method as claimed in claim 7, wherein two opposite sides of the footwall both have a plurality of grooves, each sidewall also has grooves, the substrate further comprises two pairs of two opposite fastening structures, one end of each fastening structure is located at the sidewall, the opposite end of each fastening structure is located at the footwall along a direction extending from the sidewall to the footwall, each end of the fastening structure located at the sidewall and the footwall has two through-holes, the grooves are connected with the corresponding through-holes.

9. The method as claimed in claim 8, wherein each sidewall of each metal sheet comprises a bending member and an extending member, each bending member has a cavity, one end of the reinforcing member successively passes through one groove formed on the footwall or sidewalls, one through-hole connected with the groove, a cavity adjacent to the through-hole, another through-hole facing the through-hole, and then the end of the reinforcing member is bent to form a hook, an opposite end of the reinforcing member also successively passes through another groove formed on the footwall or sidewalls, another through-hole connected with the groove, the cavity adjacent to the through-hole, a through-hole facing the another through-hole, and then the opposite end of the reinforcing member is partly bent to form another hook.

10. The method as claimed in claim 9, wherein each bending member have a width of 0.8 mm to 1.0 mm perpendicular to a direction from a connecting member located at one side of a metal sheet to an adjacent connecting member located at the opposite side of the metal sheet, each extending member has a width of 0.3 mm to 0.5 mm perpendicular to a direction from a connecting member located at one side of a metal sheet to an adjacent connecting member located at the opposite side of the metal sheet, the width of the extending members is equal to the thickness of the sidewall.

11. The method as claimed in claim 6, wherein the plurality of connecting members are respectively positioned in the plurality of gaps, such that the metal sheets and the two main bases are bonded together through the plurality of connecting members.

12. The method as claimed in claim 6, wherein each of the plurality of connecting members has a width of 0.02 mm to 0.7 mm along a direction from an adjacent connecting member located at one side of metal sheet to another adjacent connecting member located at an opposite side of the metal sheet.

13. The method as claimed in claim 2, further comprises thinning sections of a portion of each of the opposite sidewalls to form an accommodating groove, wherein the non-conductive member covers at least a portion of the footwall and the two opposite sidewalls, and is further positioned in the accommodating grooves on the two opposite sidewalls.

14. The method as claimed in claim 1, wherein the plurality of reinforcing members are made of a metal, each of the plurality of reinforcing members has an isolative layer having a thickness of 10 μm to 30 μm.

15. The method as claimed in claim 1, wherein the plurality of reinforcing members are made of a glass fiber, each of the plurality of reinforcing members has a protective layer having a thickness of 0.02 mm to 0.5 mm.

16. The method as claimed in claim 1, wherein each of the plurality of metal sheets comprises an end wall and two sidewalls, the two sidewalls being perpendicularly and respectively connected with two opposite ends of the end wall.

17. The method as claimed in claim 1, wherein the liquid resin filled in each of the plurality of gaps forms a plurality of connecting members and a non-conductive member.

* * * * *